United States Patent
Wang et al.

(10) Patent No.: US 7,848,402 B1
(45) Date of Patent: Dec. 7, 2010

(54) PHASE-ADJUSTED PRE-EMPHASIS AND EQUALIZATION FOR DATA COMMUNICATION

(75) Inventors: Shoujun Wang, Kanata (CA); Yuming Tao, Kanata (CA); Tad Kwasniewski, Ottawa (CA); William Bereza, Nepean (CA)

(73) Assignee: Altera Corporation, San Jose, CA (US)

( * ) Notice: Subject to any disclaimer, the term of this patent is extended or adjusted under 35 U.S.C. 154(b) by 745 days.

(21) Appl. No.: 11/239,703

(22) Filed: Sep. 29, 2005

(51) Int. Cl.
*H03H 7/30* (2006.01)
*H03H 7/40* (2006.01)
*H03K 5/159* (2006.01)

(52) U.S. Cl. ............... 375/232; 375/350; 333/28 R

(58) Field of Classification Search ......... 375/229–234, 375/285, 296, 346, 350; 455/43; 333/28 R; 708/300, 323
See application file for complete search history.

(56) References Cited

U.S. PATENT DOCUMENTS

| | | | | |
|---|---|---|---|---|
| 4,025,719 | A * | 5/1977 | Nussbaumer | 375/235 |
| 4,403,252 | A * | 9/1983 | Ragan et al. | 725/31 |
| 5,313,298 | A * | 5/1994 | Meeker | 375/240.01 |
| 5,651,029 | A * | 7/1997 | Yang et al. | 375/296 |
| 5,815,104 | A * | 9/1998 | Jackson et al. | 341/144 |
| 5,892,701 | A * | 4/1999 | Huang et al. | 708/819 |
| 5,986,972 | A * | 11/1999 | Li | 367/13 |
| 6,212,229 | B1 * | 4/2001 | Salinger | 375/224 |
| 6,263,077 | B1 * | 7/2001 | Zuranski et al. | 379/406.08 |
| 6,624,691 | B1 * | 9/2003 | Sasaki | 329/304 |
| 7,224,725 | B2 * | 5/2007 | Kim | 375/232 |
| 7,256,720 | B2 * | 8/2007 | Fukuda | 341/143 |
| 7,321,620 | B2 * | 1/2008 | Nakahira et al. | 375/232 |
| 2001/0009483 | A1 * | 7/2001 | Satoh et al. | 360/65 |
| 2001/0031001 | A1 * | 10/2001 | Gazsi et al. | 375/232 |
| 2001/0035994 | A1 * | 11/2001 | Agazzi et al. | 359/152 |
| 2003/0169809 | A1 * | 9/2003 | Kim | 375/230 |
| 2005/0157780 | A1 * | 7/2005 | Werner et al. | 375/232 |
| 2006/0140287 | A1 * | 6/2006 | Alon et al. | 375/260 |
| 2007/0071083 | A1 * | 3/2007 | Canagasaby et al. | 375/229 |

(Continued)

OTHER PUBLICATIONS

Sohn, Y.-S., Bae, S.-J. Park, H.-J. and Cho, S.-I., "A 1.2 Gbps CMOS DFE receiver with the extended sampling time window for application to the SSTL channel," IEEE Symposium on VLSI Circuits Digest of Technical Papers. pp. 92-93. Jun. 2002.

(Continued)

*Primary Examiner*—Jean B Corrielus
(74) *Attorney, Agent, or Firm*—Ropes & Gray LLP; Jeffrey H. Ingerman

(57) ABSTRACT

Methods and circuits are provided for producing phase-adjusted pre-emphasis and equalization. In applications in which little or no phase distortion occurs during signal transmission, propagation, or reception, linear-phase pre-emphasis or equalization can be used to reduce or eliminate phase distortion introduced by the pre-emphasis or equalization. Linear phase, constant group delay FIR filters or circuits may have odd numbers of coefficients symmetrical about the middle coefficient. In applications in which signal phase distortion occurs, linear phase or non-linear phase pre-emphasis or equalization can be used to reduce or compensate for the phase distortion. Phase compensation may be effected using FIR pre-emphasis and equalization filters and circuits. Non-linear phase FIR filters may have different numbers and combinations of coefficients.

21 Claims, 8 Drawing Sheets

U.S. PATENT DOCUMENTS

2007/0155314 A1* 7/2007 Mohebbi .................. 455/11.1

OTHER PUBLICATIONS

Sohn, Y.-S., Bae, S.-J., Park, H.-J., Kim, C.-H. and Cho, S.-I., "A 2.2 Gbps CMOS look-ahead DFE receiver for multidrop channel with pin-to-pin time skew compensation," Proceedings of the IEEE 2003 Custom Integrated Circuits Conference, pp. 473-476, Sep. 2003.

Zerbe, J. L., et al., "Equalization and clock recovery for a 2.5-10-Gb/s 2-PAM/4-PAM backplane transceiver cell," IEEE J. Solid-State Circuits, vol. 38, No. 12, pp. 2121-2130, Dec. 2003.

M. Li, S. Wang, Y. Tao, and T. Kwasniewski, "FIR Filter Optimisation as Pre-Emphasis of High-Speed Backplane Data Transmission," IEEE Electronics Letters, vol. 40, No. 14, pp. 912-913, Jul. 2004.

J. Redd, and C. Lyon, "Spectral Content of NRZ Test Patterns," EDN Design Feature (www.edn.com), pp. 67-72, Sep. 2, 2004.

Landman, P., et al., "A transmit architecture with 4-tap feedforward equalization for 6.25/12.5Gb/s serial backplane communications," 2005 IEEE International Solid-State Circuits Conference Digest of Technical Papers, pp. 66-67 and 585, Feb. 2005.

Chen, J., Li, M. and Kwasniewski, T., "Decision feedback equalization for high-speed backplane data communications," Proceedings of the 2005 IEEE International Symposium on Circuits and Systems. vol. 2. pp. 1274-1277. May 2005.

"Mass noun," http://en.wikipedia.org/wiki/Mass_noun, accessed on Jan. 27, 2009.

QuickLogic Corporation, "Amphion Fixed Coefficient, Single-Channel FIR Filters," Sep. 20, 2001, http://www.quicklogic.com/images/amphion_fixed_coef_fir.pdf, accessed on Jan. 27, 2009.

* cited by examiner $$H(z) = 1 - c \cdot z^{-1}$$

$$y[n] = x[n] - c_1 \cdot \hat{y}[n-1] - c_2 \cdot \hat{y}[n-2]$$

PHASE-ADJUSTED PRE-EMPHASIS AND EQUALIZATION FOR DATA COMMUNICATION

BACKGROUND OF THE INVENTION

This invention relates to pre-emphasis and equalization methods and circuitry for data communication. Pre-emphasis and equalization are used to improve signal transmission and reception along transmission links by boosting the amplitude of particular signal components.

Transmission links, such as circuit traces, integrated circuit interconnect lines or pins, backplanes, wires or cables, antennas, air, or other transmission media, may attenuate, delay, or otherwise change the characteristics of signals traveling through them. Signal attenuation may be frequency dependent, different frequency signal components being attenuated by different amounts. In general, high frequency signal components are attenuated more than lower frequency components. Phase delay or group delay caused by the transmission link may also be frequency dependent, causing different signal frequency components to arrive at the receiver with different delays.

In dielectric conductors such as those commonly used in backplanes, transmission losses are mainly due to skin effect and dielectric losses. Skin effect losses have a square root dependence on frequency, and cause non-linear phase delay distortion. Dielectric losses increase approximately linearly with frequency, and result in approximately linear phase delay and constant group delay.

In order to counter-act the attenuation of the signals as they travel through the transmission media, transmitter circuits often use pre-emphasis techniques to increase the amplitude of particular signal components before transmission. For transmission in integrated circuit lines in which attenuation typically increases with frequency, pre-emphasis may amplify higher frequency components more than lower frequency components, such that all signal components arrive at the receiver with approximately the same amplitude. In addition to, or instead of using pre-emphasis, receiver circuits often use equalization techniques to improve signal transmission. Equalization may consist in amplifying certain components of the received signal, while leaving other components unchanged. In a manner similar to pre-emphasis, equalization may be used to counter-act the frequency-dependent attenuation caused by signal transmission.

While pre-emphasis and equalization methods and circuits for adjusting signal amplitude are well known, these methods typically do not adjust for phase delay introduced in the signal during transmission, or phase delay caused by the transmission, pre-emphasis or equalization circuitry. Phase delay distortion from these and other sources may reduce the quality of the received signal, and may adversely affect signal transmission. This invention provides methods and circuits for phase-adjusted pre-emphasis and equalization.

SUMMARY OF THE INVENTION

The invention provides methods and circuits for producing phase-adjusted pre-emphasis and equalization.

Pre-emphasis and equalization filters and circuits with linear phase produce output signals with less phase distortion than commonly used pre-emphasis and equalization circuits. Linear phase pre-emphasis or equalization filters may include finite impulse response (FIR) filters which produce output signals related to an odd number of equally spaced time-samples of the filter input signal, the filter coefficients being symmetrical about the middle coefficient. Pre-emphasis and equalization circuits with linear phase characteristics may rely on such FIR filters for their operation.

In applications in which signal phase distortion or group delay distortion occurs during signal transmission, propagation, or reception, non-linear phase pre-emphasis or equalization can be used to compensate for the phase distortion. The distortion may be estimated from measurements or models of the transmission, propagation, and reception means and media. Appropriate phase compensation may be effected using FIR pre-emphasis and equalization filters and circuits. FIR filters with non-linear phase may be used, the filter coefficients being selected to provide the desired amplitude and phase responses.

Compensatory phase pre-emphasis or equalization may also be used in cases in which both equalization and pre-emphasis are used, and in which at least one of the pre-emphasis and equalization filters or circuits has non-linear phase. In such a case, a pre-emphasis or equalization circuit with a phase characteristic complementary to the non-linear phase may be used to reduce or eliminate phase distortion in the signal.

Further features of the invention, its nature and various advantages, will be more apparent from the accompanying drawings and the following detailed description.

BRIEF DESCRIPTION OF THE DRAWINGS

FIGS. 9A and 93 are schematic block diagrams of two-tap FIR pre-emphasis and equalization filters in accordance with the principles of invention.

DETAILED DESCRIPTION

In accordance with the invention, pre-emphasis and equalization methods and circuits are provided for improving signal transmission. Methods and circuits are provided for reducing, eliminating, or compensating phase distortion caused by pre-emphasis and equalization, and for compensating for phase distortion introduced during signal transmission. The following description and associated figures focus mainly on pre-emphasis methods and circuitry, and associated embodiments of the invention. The methods, circuitry and embodiments described herein are illustrative of the broader concepts, methods and circuits of the invention, which may also be used in other applications.

Figure 1:
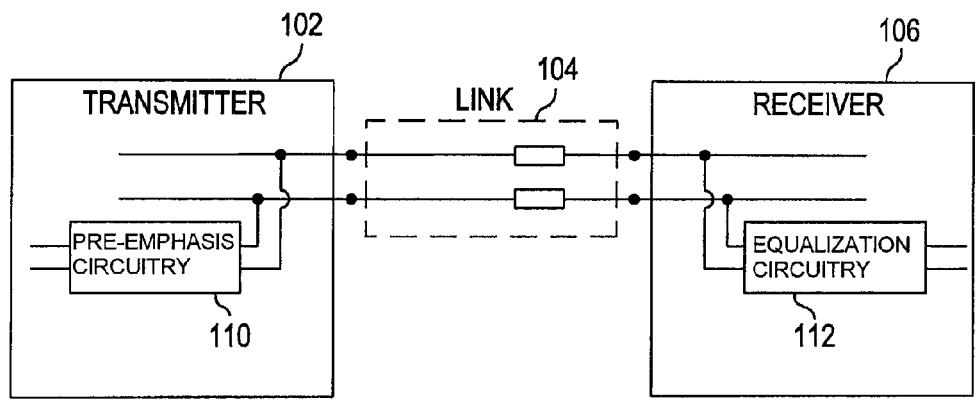
FIG. 1 is a simplified schematic circuit diagram of a transmitter, link and receiver.

FIG. 1 shows a block diagram of a transmitter 102 and a receiver 106, coupled to each other through a transmission link 104. The transmitter 102 includes circuitry operative to transmit signals along the link 104. The transmitter circuitry may, in particular, include pre-emphasis circuitry 110 operative to produce a pre-emphasis signal. The pre-emphasis circuitry may be permanently, selectively or programmably coupled to transmitter output leads. The pre-emphasis circuitry may also be coupled to the output leads through other intermediate circuitry, which may include output driver circuitry, electro-static discharge (ESD) protection circuitry, or other types of circuitry.

The receiver 106 includes circuitry operative to process signals received at its input leads, such as equalization circuitry 112. The equalization circuitry 112 may be permanently, selectively or programmably coupled to the input leads of the receiver. The equalization circuitry 112 may also be coupled to the input leads through other circuitry, such as pre-amplifier circuitry, ESD protection circuitry, or other circuitry.

Signals may be transmitted by the transmitter along one or more conductors of the link. In the embodiment shown in FIG. 1, the transmitter, receiver and link are configured to transmit and receive differential signals along two link conductors. The transmitter, receiver and link may also be used to transmit single-ended signals or multiple signals along one or more link conductors. The transmitter and receiver may also be configured to transmit and receive signals through different types of links, which may include wireless links and antennas, for example.

Signals transmitted by the transmitter 102, signals traveling along link 104, and signals received by receiver 106 may suffer from distortion, interference or other signal deterioration occurring during transmission, propagation and reception. The signal degradation may be caused by capacitive or resistive properties of the link, by characteristics of the transmitter or receiver, by improper impedance matching at the link ends, or by other factors. Pre-emphasis and equalization may be used to improve the quality of the received signal, and to properly interpret the data signal it contains.

Figure 2:
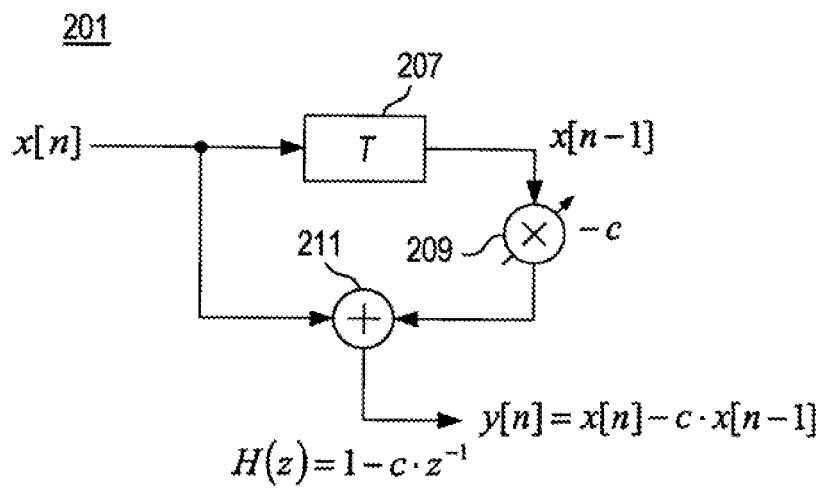
FIG. 2 is a schematic block diagram of a two-tap finite impulse response (FIR) filter of the prior art.

FIG. 2 shows a basic schematic diagram of a two-tap finite impulse response (FIR) pre-emphasis filter that is commonly used in equalization circuits. The two-tap FIR filter includes a delay element 207 configured to produce an output signal x[n−1] corresponding to a delayed version of the input signal x[n] it receives at its input. The output of the delay element is coupled to a multiplier 209 which is used to amplify or attenuate the signal x[n−1] by a factor of −c, producing a multiplier output signal −c*x[n−1]. The gain factor −c of multiplier 209 may be variable or programmably variable. Adder 211 is used to sum the output of multiplier 209 with the input signal x[n], producing an output signal equal to x[n]−c*x[n−1]. The output of the adder is coupled to the output of the two-tap FIR filter, the two-tap filter producing output signal y[n]=x[n]−c*x[n−1]. The characteristics of the pre-emphasis signal y[n] produced by two-tap FIR pre-emphasis circuit 201 may be adjusted by varying the gain −c of multiplier 209. Additional multipliers may also be used to vary the relative amplitude of the input signal x[n] in the output signal y[n]. Note that the term 'two-tap' refers to the fact that each output sample y[n] depends on two different samples of the input signal, notably sample x[n] and delayed input sample x[n−1].

Figure 3:
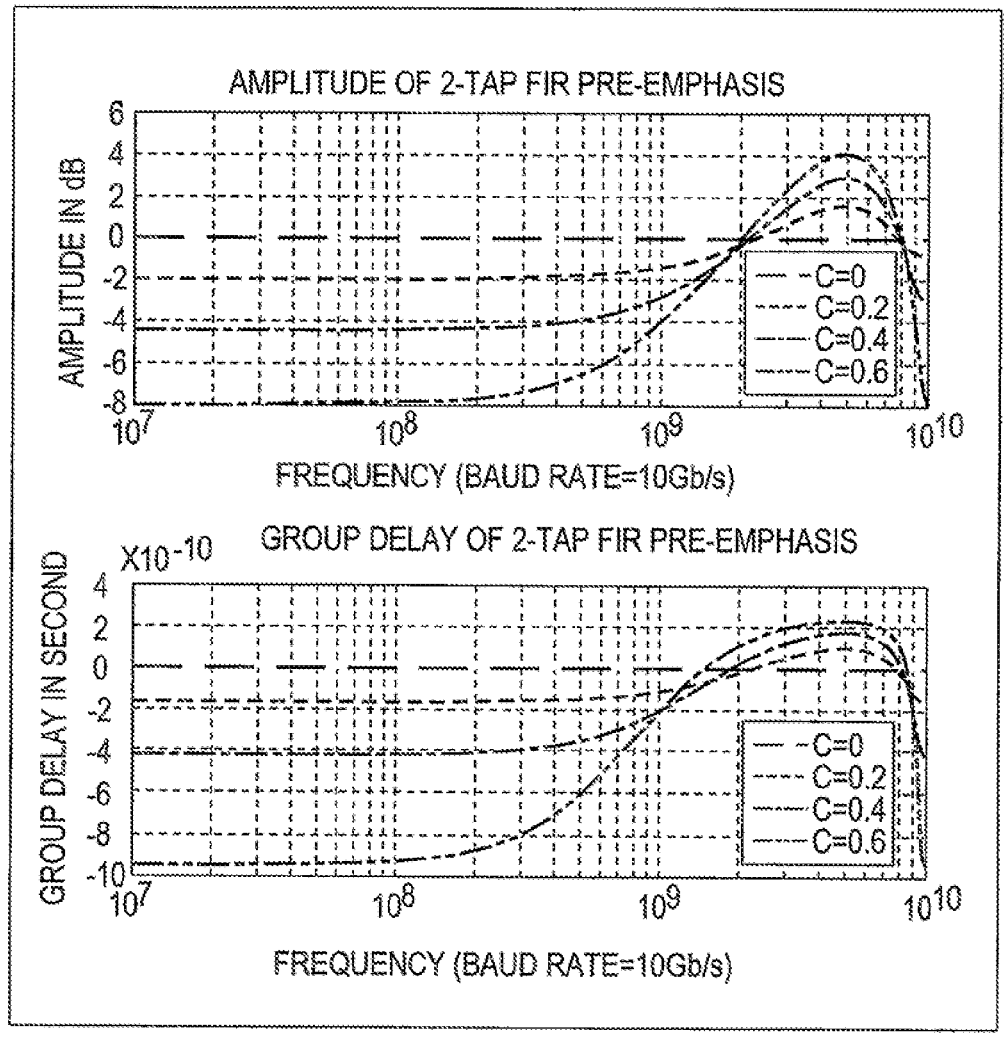
FIG. 3 is a series of plots of the frequency response of the two-tap FIR filter of FIG. 2.

The two-tap FIR filter of FIG. 2 has a frequency response equal to $H(z)=1-c*z^{-1}$. A plot of the frequency response of the filter is shown in FIG. 3 for increasing values of the gain factor c. The upper amplitude plot shows that for increasing values of c, the high-frequency boost in signal amplitude provided by the two-tap FIR filter increases. For a gain factor value of c=0, no high-frequency boost is provided as the output y[n] is equal to the input: y[n]=x[n]. For higher values of c, both high-frequency amplitude boosts and low frequency attenuation are provided. For example, for a value of c=0.6, the high frequency signal components may be amplified by as much as 12 dB more than the lower frequency signal components. Note that at frequencies above one-half of the sampling rate, corresponding to frequencies above 5 GHz in the illustrative plot of FIG. 3, the gain drops off rapidly. The drop in the gain is due to aliasing of signal frequency components above half of the baud rate, which are not accurately sampled and processed by digital processing circuitry operating at the baud rate.

The two-tap FIR filter of FIG. 2 produces a high-frequency boost in signal amplitude, as may be required to compensate for high-frequency signal attenuation occurring during signal transmission and propagation. However, the two-tap FIR filter also adds non-linear phase or group delay distortion to the signal, thereby reducing the quality of the transmitted signal. The lower plot of FIG. 3 shows the group delay of the two-tap FIR filter for different values of the gain factor c. The two-tap FIR filter introduces group delay distortion in the signal, most noticeably in the higher frequency signal components. For example, in the group delay plot of FIG. 3, signal components with frequencies above approximately one-hundredth of the baud rate, corresponding to frequencies of approximately 100 MHz ($=10^8$ $s^{-1}$) suffer from group delay distortion. The non-linear phase introduced by the two-tap FIR filter causes group delay distortion in the signal, causing high frequency components to be delayed with respect to lower frequency components. The group delay distortion may increase signal spread at the receiver, increasing inter-symbol interference (ISI), reducing the sampling window within which the signal can be accurately sampled, and more generally lowering the quality of the received signal. The group delay distortion caused by the two-tap FIR pre-emphasis filter may therefore reduce the filter's effectiveness in improving signal quality.

Figure 4:
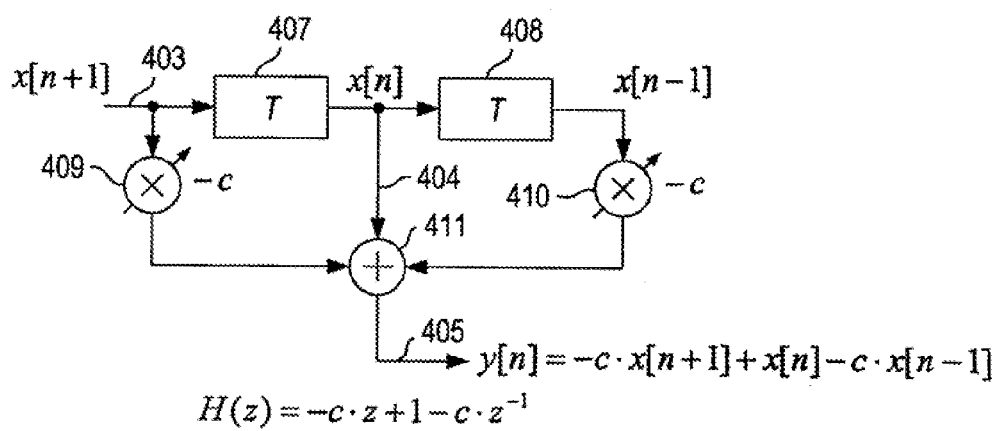
FIG. 4 is a schematic block diagram of a three-tap FIR filter in accordance with the invention.

FIG. 4 shows a schematic diagram of a symmetrical three-tap FIR pre-emphasis filter in accordance with the principles of the invention. Circuit 401 contains two delay elements 407 and 408, producing delayed versions of the input signal x[n+1]. The first delay element 407 produces a first delayed version x[n] of the input signal x[n+1] applied at input lead 403. Second delay element 408 coupled to the output lead 404 of first delay element 407 produces a second delayed version x[n−1] of the delayed input signal x[n]. Two variable multipliers 409 and 410 with gains equal to −c, coupled respectively to the filter input lead 403 and to the output lead of second delay element 408, produce scaled versions of the x[n+1] and x[n−1] signals. Adder 411 sums the outputs of multipliers 409 and 410 with the output of first delay element 407, to produce an output signal y[n] at output lead 405 such that y[n]=−c*x[n+1]+x[n]−c*x[n−1]. Note that the three-tap FIR pre-emphasis filter 401 is illustrative of the principles of the invention, and should not be understood to limit the principles of the invention to the particular circuit and structure shown in FIG. 4.

Figure 5:
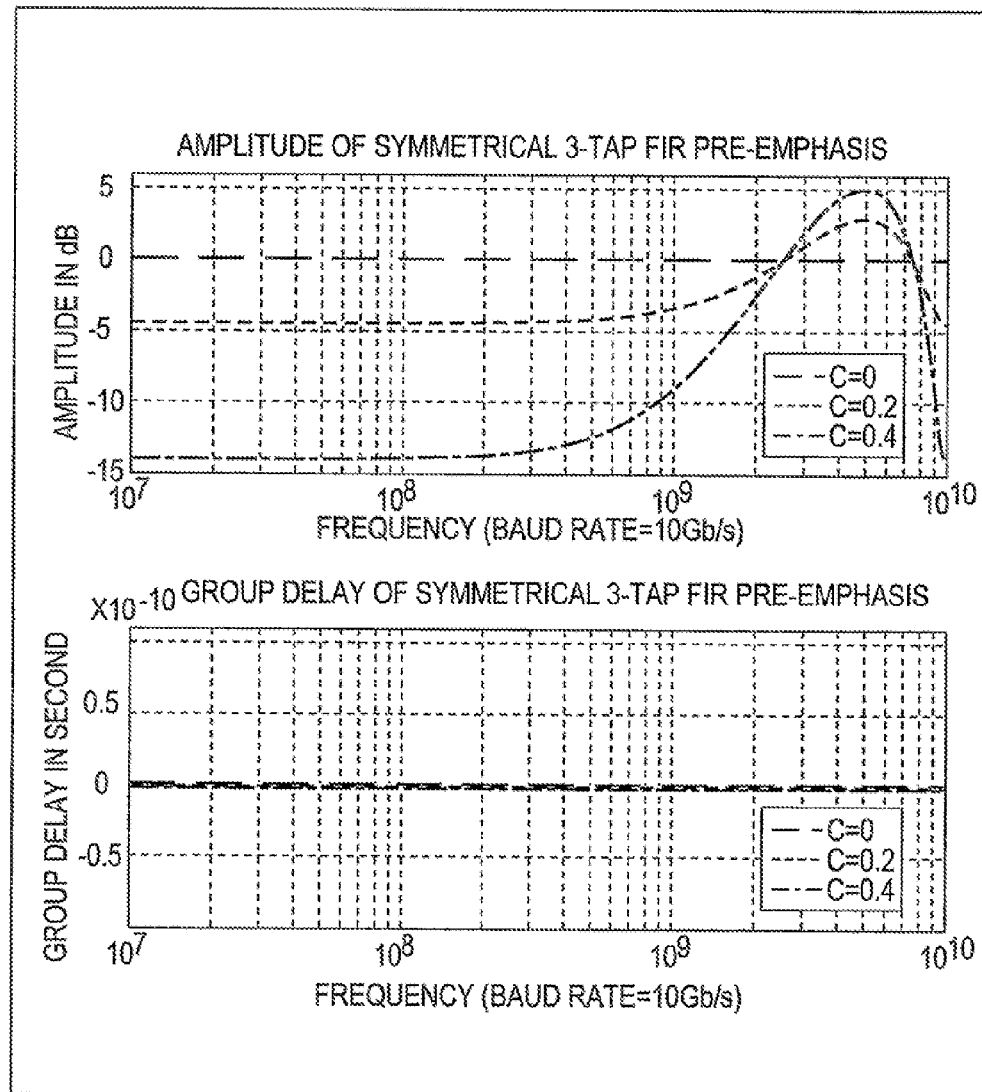
FIG. 5 is a series of plots of the frequency response of the three-tap FIR filter of FIG. 4.

The symmetrical three-tap FIR pre-emphasis filter 401 has a frequency response equal to $H(z)=-c*z+1-c*z^{-1}$. The frequency response of the three-tap FIR pre-emphasis filter 401 is shown in FIG. 5 for various values of gain factor c. The upper plot of FIG. 5 shows the amplitude response of the filter for values of c in the range [0-0.4]. For c=0, the filter has a flat amplitude response as y[n]=x[n]. For increasing values of c, the three-tap FIR filter produces a high-frequency amplitude boost of increasing amplitude, and a low-frequency attenuation of the signal of increasing amplitude. For example, for a value of c=0.4, high frequency signal components are increased by as much as 5 dB, while low frequency components below 100 Mb/s (=$10^8$ b/s) are attenuated by approximately 14 dB.

Both the three-tap FIR filter 401 of FIG. 4 and the two-tap FIR filter 201 of FIG. 2 have similar amplitude responses. In particular, both filters attenuate low frequency signal components and amplify high-frequency components up to about half the baud rate. By appropriately adjusting the value of the gain factor parameters c in each of the filters, similar amplitude responses may be obtained.

While FIR filters 201 and 401 have similar amplitude responses, the filters have different phase responses, as shown in FIGS. 3 and 5. The lower plot of FIG. 5 shows the group delay of the three-tap FIR pre-emphasis filter 401. The group delay plot is flat for all values of the gain factor c, indicating that the filter 401 does not add group delay distortion to the signals it processes. The filter 401 may be used to provide a high-frequency pre-emphasis amplitude boost to signals to counteract high-frequency signal attenuation during signal transmission and reception, without introducing group delay distortion in the signal. In this respect, filter 401 produces a higher quality pre-emphasis signal than the two-tap FIR filter 201 of FIG. 2.

Figure 6:
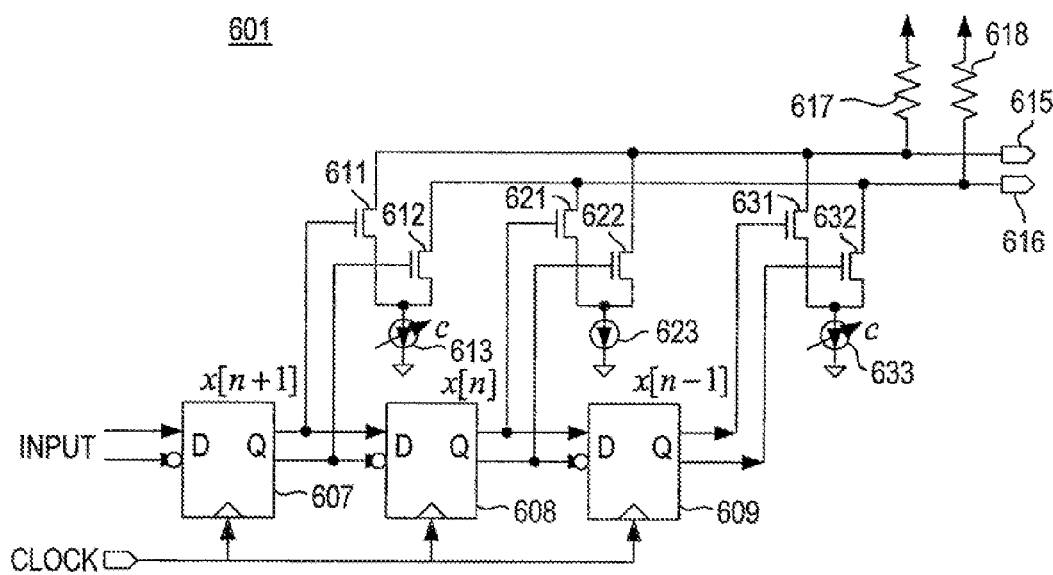
FIG. 6 is a schematic circuit diagram of a three-tap FIR filter similar to that of FIG. 4 in accordance with the principles of the invention.

The three-tap FIR pre-emphasis filter 401 may be implemented in circuitry such as that shown in FIG. 6, for example. FIG. 6 shows a block diagram of a circuit implementation of filter 401 using flip-flops and switches. The circuit embodiment 601 includes three flip-flops 607, 608 and 609 coupled to a common clock line. The first flip-flop 607 receives a single-ended or differential input signal at its one or more input leads, and produces a differential output signal x[n+1]. The differential output signal of flip-flop 607 serves as input signal to flip-flop 608, which produces a one baud-period delayed differential output signal x[n]. Similarly, the output signal of flip-flop 608 serves as input to flip-flop 609, flip-flop 609 producing a differential output signal x[n−1] delayed by an additional baud-period. Note that while flip-flops are used to produce delayed versions of the input signal in circuit 601, other methods, circuitry or delay chains may be also be used. Alternative delay circuitry may produce differential pairs of signals similar to the outputs of flip-flops 607-609, or single-ended signals.

The differential output signals produced by the flip-flops 607-609 are used to control a current-mode logic (CML) driver. The CML driver of FIG. 6 includes current sources 613, 623, and 633, and switches 611-612, 621-622, and 631-632. Each flip-flop 607-609 controls one pair of switches of the CML driver, each pair of switches selectively coupling one of current sources 613, 623, and 633 to the outputs leads 615 and 616. In the particular embodiment 601 of FIG. 6, the differential output leads of flip-flop 607 are coupled to the gate terminals of switches 611 and 612, the switches forming a differential pair of transistors. Switches 611 and 612 are coupled between variable current source 613 and output leads 615 and 616. The output leads may additionally be coupled to pull-up circuitry, such as pull-up resistors 617 and 618 shown in FIG. 6. The pull-up resistors may serve to produce a voltage output signal at the output leads 615-616 of the CML driver. Other types of pull-up loads may be used instead of pull-up resistors 617 and 618, including MOS devices or other types of pull-up switches. Pull-up resistors 617 and 618 may have values of approximately 50 ohms.

The output leads 615 and 616 may be coupled to additional pairs of switches in addition to switches 611 and 612 as described above. In the three-tap FIR implementation of FIG. 6, the output leads are also coupled to a differential pair of switches 621 and 622, which are controlled by the output of flip-flop 608 and selectively couple the input leads to current source 623. The output leads are also coupled to differential pair of switches 631 and 632, which are controlled by the output of flip-flop 609 and are coupled to current source 633. Each pair of switches is operative to selectively couple the output leads to a current source, selectively providing a current at one output lead and decoupling the other output lead from the current source. The currents carried by the switches coupled to each output lead combine at the output lead, producing a total output current equal to the sum of the individual switch currents. Output leads 615 and 616 are the output leads of the pre-emphasis circuitry, and may therefore be coupled to a transmission link, to other pre-emphasis or transmitter circuitry, or to other circuitry.

Each of the current sources 613, 623, and 633 may be fixed, variable or programmably variable current sources. Programmably variable current sources with current amplitudes controlled by binary-weighted digital-to-analog converters (DACs) may be particularly useful. In the embodiment shown in FIG. 6, for example, current source 623 produces a current of a fixed value and current sources 613 and 633 are programmably variable. Current sources 613 and 633 produce currents of amplitude c times the current of source 623. The ratio of the currents produced by the various current sources produces a pre-emphasis output signal at output leads 615 and 616 that is related to the signal y[n]=−c*x[n−1]+x[n]−c*x[n+1]. Note that in circuit 601, output lead 615 is coupled to switches coupled to the non-inverting outputs of flip-flops 607 and 609 and to the inverting output of flip-flop 608. The sign of the x[n−1] and x[n+1] factors is therefore the opposite of that of the x[n] factor. Note that other circuit embodiments may be used to vary the signs of each of the factors in the sum. Different combinations of current source values may also be used.

As described above, the circuitry of FIG. 6 may be used to implement a three-tap FIR filter, and to produce linear-phase pre-emphasis in accordance with the principles of the invention. The circuitry of FIG. 6 is illustrative of the principles of the invention, and shows one possible embodiment of circuitry in accordance with the invention. Other embodiments may include different circuitry for producing delayed versions of the input signal. While circuit 601 uses a current-drive circuit for producing the pre-emphasis signal, voltage-drive circuitry may also be used. Furthermore, different types of current-drive circuitry may be used. For example, current sources coupled to the upper power supply may be used instead of the current sinks shown in FIG. 6.

More generally, the number of taps in the FIR filter may be varied. While diagrams 401 and 601 of FIGS. 4 and 6 show embodiments including three-tap filters, more or fewer taps may be used depending on the requirements of the circuit. In general, for linear phase pre-emphasis, an odd number of taps may be used, the taps having symmetrical coefficients about the central tap. However, other numbers of taps or combinations of tap coefficients may be used, notably in cases in which pre-emphasis with non linear-phase is required.

The linear-phase, constant group delay characteristic of filters 401 and 601 is more generally a property of FIR filters with symmetrical coefficients. All FIR filters with an odd number of coefficients that are symmetrical about the middle coefficient have linear phase. For example, a five-tap FIR filter corresponding to the equation y[n]=−a*x[n+2]−b*x[n+1]+x[n]−b*x[n−1]−a*x[n−2] with equal first and last coefficients a and equal second and second-to-last coefficients b has a linear phase response.

Pre-emphasis with linear phase and constant group delay may be especially useful for use with backplanes that do not introduce phase distortion into signals. For example, in backplanes in which dielectric loss dominates and skin effect losses are relatively small, transmission along the backplane may occur with a fairly constant group delay at high frequency. In this situation, a linear-phase pre-emphasis filter may be used to compensate for signal attenuation in the backplane without changing the phase of the signal. Alternatively, the phase of the pre-emphasis may be adjusted to compensate for the phase characteristic of the channel. Pre-emphasis characteristics may be varied by changing the value of the gain coefficient of multipliers 409 and 410, or by changing the amplitude of currents supplied by sources 613, 623, and 633. Pre-emphasis characteristics may also be varied by using FIR circuitry with more or fewer taps.

While an odd number of taps with symmetrical coefficients may be used to produce linear-phase pre-emphasis, other combinations of numbers of taps and coefficients may be used to produce non-linear phase pre-emphasis. For links with non-linear phase characteristics, or in situations under which non-linear phase is to be added to the transmitted signal, the number of pre-emphasis taps and the value of the pre-emphasis coefficients may be adjusted to add a desired phase to the transmitted signal. The phase added by the pre-emphasis filter or circuitry may be adjusted to compensate for the phase distortion caused by transmitter circuitry, the link, equalization circuitry including decision feedback equalization (DFE) circuitry, or other sources of phase distortion. Even or odd numbers of taps, with symmetrical, anti-symmetrical, or other coefficients may be used.

The coefficients and number of taps may be fixed during the design of the pre-emphasis circuit, to compensate for characteristics of the link, receiver and transmitter which may be estimated from models of the circuitry. The coefficients and number of taps may alternatively be fixed after testing of the circuitry and link, or after measuring or estimating characteristics of the circuitry and link. The coefficients and number of taps may also be adjusted during fabrication of circuitry, by using laser trimming or other fabrication techniques to adjust the amplitude of the currents supplied by current sources 613, 623, and 633, for example. The coefficients and number of taps may also be adjustable or programmable in the pre-emphasis circuit, for example by including memory or switches coupled to the pre-emphasis circuit, the memory or switches being operative to vary the gain coefficients of the various taps, to activate additional circuit taps, or to vary the current supplied by the current sources. Selectable or programmable pre-emphasis may be used to vary the pre-emphasis based on the characteristics of a particular link or receiver being used. Selectable or programmable pre-emphasis may also be used to adaptively vary the pre-emphasis.

The embodiments described in the context of FIGS. 2, 4, and 6 above show pre-emphasis circuitry in accordance with the principles of the invention. Phase compensation may also be used in equalization circuitry included in receivers, such as equalization circuitry 112 shown in FIG. 1. Equalization circuitry may be used to process the signals received by the receiver, to improve signal quality and to allow the data contained in the signal to be properly interpreted. The equalization circuit may amplify the received signal or particular signal components of the received signal, to compensate for the attenuation of the signal during transmission, propagation and reception. Commonly used equalization circuits may also introduce phase or group delay distortion into the signal, thereby reducing the overall signal quality.

Figure 7:
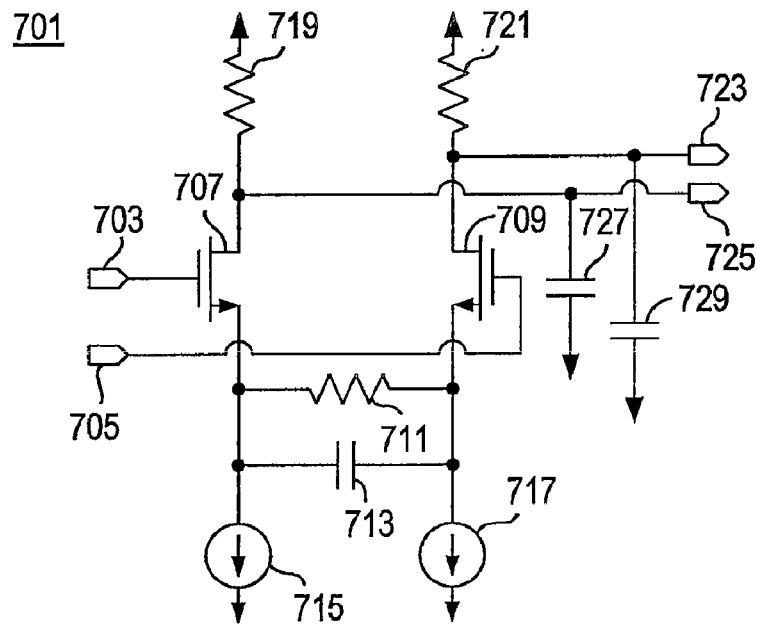
FIG. 7 is a schematic circuit diagram of an analog equalization circuit of the prior art.
Figure 8:
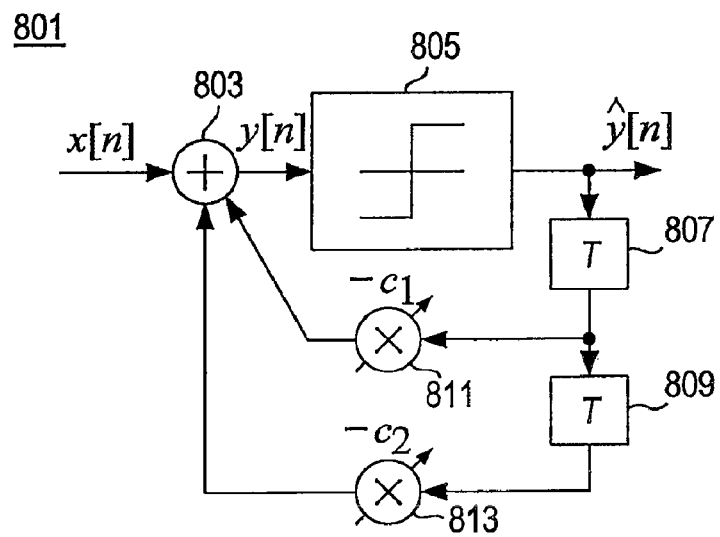
FIG. 8 is a schematic block diagram of a three-tap decision feedback equalization (DFE) filter of the prior art.

FIGS. 7 and 8 show illustrative equalization circuitry of two basic types in accordance with the invention. FIG. 8 shows an illustrative three-tap decision feedback equalization (DFE) circuit. The DFE equalization circuit 801 includes a decision device 805, which is used to produce an estimate $\hat{y}[n]$ of the output signal $y[n]$. Delay elements 807 and 809 coupled in series to the output of decision device 805 produce one and two baud-period delayed signals $\hat{y}[n-1]$ and $\hat{y}[n-2]$ of the output signal, respectively. The delayed signals are fed back to input adder 803 through multipliers 811 and 813. Multiplier 811 produces an output $-c_1*\hat{y}[n-1]$, and multiplier 813 produces an output $-c_2*\hat{y}[n-2]$. Adder 803 produces output signal $y[n]$ as the sum of input signal $x[n]$ and signals $-c_1*\hat{y}[n-1]$ and $-c_2*\hat{y}[n-2]$. The output signal of DFE equalization circuit 801 is equal to $y[n]=x[n]-c1*\hat{y}[n-1]-c2*\hat{y}[n-2]$, where $x[n]$ is the input signal and $\hat{y}[n]$ is an estimate of the output signal $y[n]$.

DFE equalization circuit 801 may provide a high frequency boost to the input signal. The gain factors $c_1$ and $c_2$ may be adjusted to produce different amplitude responses, for example to increase the amplitude of high frequency components relative to lower frequency components. DFE equalization circuits typically introduce group delay distortion into the output signal, thus limiting their effectiveness in providing signal equalization.

FIG. 7 shows an illustrative analog equalization circuit 701 including two transistors 707 and 709 coupled to the input leads 703 and 705 of the equalization circuit. The source terminals of transistors 707 and 709 are each coupled to a current source 715 and 717, respectively, and to opposite nodes of a resistor 711 and capacitor 713. Each drain terminal of transistors 707 and 709 is coupled to a loading resistor 719 or 721, a loading capacitor 727 or 729, and an equalization circuit output lead 723 or 725, respectively. Circuit 701 is illustrative, and other analog equalization circuits may be used in accordance with the principles of the invention.

The response of the analog equalization circuit of FIG. 7 may be adjusted by varying the values of resistor 711 and capacitor 713. For example, the frequency response of analog equalization circuit 701 may be adjusted to provide a boost in amplitude to the high frequency components of the differential input signal applied to input leads 703 and 705, while attenuating lower frequency components. While the amplitude and phase responses of circuit 701 may be adjusted by varying the values of the various circuit elements, circuit 701 may have a non-linear phase response which may introduce group delay distortion into the output signal. The group delay distortion may reduce the effectiveness of the analog equalization filter, thus reducing the sampling window within which the signal can be accurately sampled.

Figure 9A:
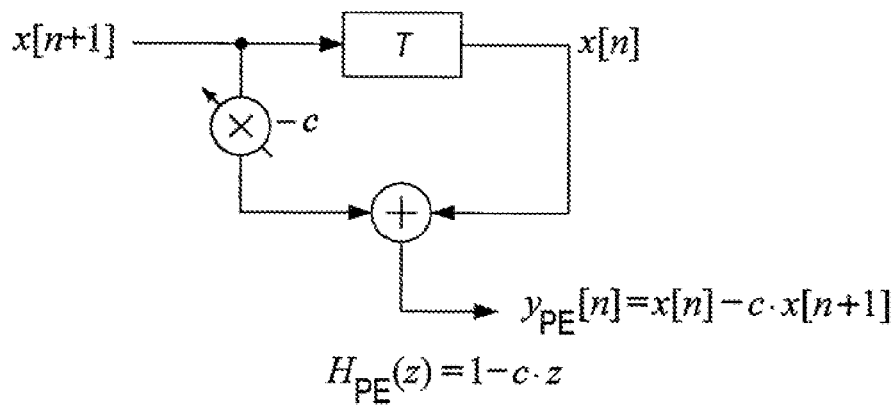
Figure 9B:
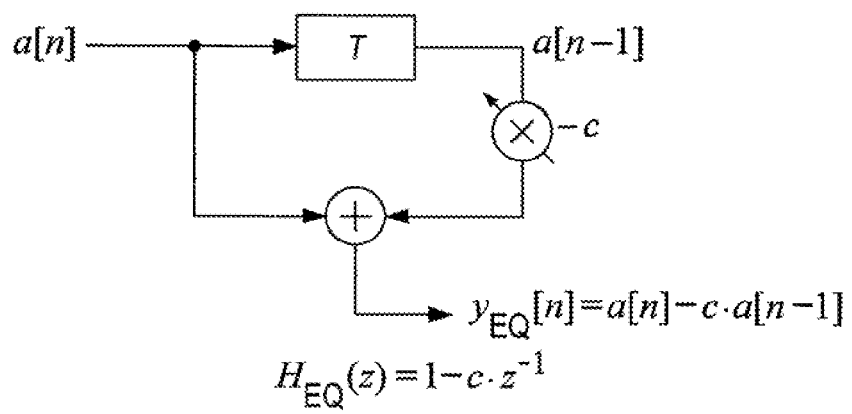

In order to compensate for the group delay distortion caused by equalization circuits such as analog equalization circuit 701, DFE equalization circuit 801, or other non-linear phase equalization circuits, a pre-emphasis circuit with complementary phase may be used. By way of example, the filters of FIGS. 9A and 9B illustratively show a pre-emphasis filter 901 and an equalization filter 903, each of the filters having a non-linear phase response, and the combination of the two filters having linear phase. The pre-emphasis filter 901 of FIG. 9A is a two-tap, pre-tap FIR filter, producing an output signal $y_{PE}[n]=x[n]-c*x[n+1]$. Filter 901 may have a frequency response $H_{PE}(z)=1-c*z$. Much like the two-tap filter of FIG. 2, filter 901 may provide amplification of high frequency components of signals, and attenuation of lower frequency components. The two-tap filter 901 may also produce non-linear phase complementary to the phase of filter 201, causing group delay distortion in its output. The equalization filter 903 of FIG. 9B is a two-tap, post-tap FIR filter, which produces an output signal $y_{EQ}[n]=a[n]-c*a[n-1]$. Filter 903 may have a frequency response $H_{EQ}(z)=1-c*z^{-1}$.

Filter 903 is substantially identical to filter 201, and may have amplitude and frequency responses substantially identical to those shown in FIG. 3 for different values of gain factor c. In particular, filter 903 may produce non-linear phase, thereby introducing group delay distortion in its output signal.

While pre-emphasis filter 901 and equalization filter 903 each produce non-linear phase and introduce group delay distortion into their respective output signals $y_{PE}[n]$ and $y_{EQ}[n]$, the series combination of the two filters produces a linear phase filter with constant group delay. In particular, by setting $a[n]=y_{PE}[n]$, the equation of the combined response $y_{COMB}[n]$ of the two filters becomes:

$$y_{COMB} = y_{EQ}[n] = a[n] - c^*a[n-1] = y_{PE}[n] - c^*y_{PE}[n-1]$$
$$= x[n] - c^*x[n+1] - c^*(x[n-1] - c^*x[n]) = x[n] - c^*x[n+1] - c^*x[n-1] + c^{2*}x[n] = -c^*x[n+1] + (1+c^2)^*x[n] - c^*x[n-1]$$

In terms of frequency response, the combined filter response $H(z)$ may be calculated as:

$$H_{COMB}(z) = H_{PE}(z) * H_{EQ}(Z) = (1-c^*z)*(1-c^*z^{-1}) = -c^*z + (1+c^2) - c^*z^{-1}$$

The combined filter response equation $y_{comb}[n]$ has an odd number of taps with symmetrical coefficients about the center tap. The filter formed by the series combination of circuits 901 and 903 may therefore provide linear phase and constant group delay, much like filter 401 of FIG. 4.

As shown in the exemplary case of FIGS. 9A and 9B, appropriate non-linear phase pre-emphasis and equalization filters may be selected to produce combined responses with linear or approximately linear phase. While filters 901 and 903 shown in FIG. 9 are both two-tap FIR filters, other filter combination may be used. For example, an analog equalization filter such as filter 701 or a DFE equalization filter such as filter 801 may be used in combination with an FIR pre-emphasis filter, the responses of both filters being adjusted to produce a combined linear-phase or approximately linear-phase response. The phase response of analog equalization filters, DFE equalization filters, and other pre-emphasis or equalization filters may be calculated or estimated from circuit models or measurements. Compensatory phase filters may be designed to have phase responses complementary or approximately complementary to the phase response or the phase estimates.

The pre-emphasis and equalization filters or circuits may be coupled to each other in a series combination. Alternatively, the pre-emphasis and equalization filters or circuits may be coupled in series through one or more links, filters, or circuits. In a preferred embodiment, the pre-emphasis and equalization circuits are typically coupled to each other through at least one transmission link such as transmission link 104 of FIG. 1.

In accordance with the invention, equalization circuitry with linear phase characteristics may be used to reduce the phase or group delay distortion caused by equalization circuitry, pre-emphasis circuitry, or other circuit components. Linear-phase, constant group delay equalization filters and circuits may include FIR filters and circuits, the FIR filters and circuits having odd numbers of coefficients, the coefficients being symmetrical about the middle coefficient. Non-linear phase equalization may also be used to compensate for non-linear phase distortion introduced in the signal at various stages of the signal transmission, propagation or reception.

Pre-emphasis or equalization circuitry is provided for reducing or compensating for phase distortion occurring during signal transmission, propagation and reception. One skilled in the art will appreciate that the invention can be practiced by other than the described embodiments, which are presented for purposes of illustration and not of limitation. The invention is limited only by the claims which follow.

The invention claimed is:

1. Circuitry operative to produce a pre-emphasis signal or an equalization signal from a first signal, the circuitry comprising:

first and second delay elements operative to produce, from the first signal, second and third signals corresponding to the first signal and delayed by one and two time steps, respectively; and circuitry operative to apply variable multiplicative coefficients to the first, second and third signals to form a linear combination of the first, second and third signals, such that the first and third signals have equal multiplicative coefficients in the linear combination, to produce an output signal corresponding to the linear combination, the circuitry operative to apply variable multiplicative coefficients comprising:

first, second and third current sources producing currents with amplitudes related to the multiplicative coefficients in the linear combination, and first, second and third switches operative to selectively combine the currents produced by the first, second and third current sources to produce the output signal, the first, second and third switches being controlled by signals related to the first, second and third signals respectively.

2. The circuitry operative to produce a pre-emphasis signal or an equalization signal of claim 1, wherein the phase of the output signal is linearly related to the phase of the first signal.

3. The circuitry operative to produce a pre-emphasis signal or an equalization signal of claim 1, wherein the first and second delay elements are flip-flops.

4. The circuitry operative to produce a pre-emphasis signal or an equalization signal of claim 1, wherein the output signal is related to the first signal by a transfer function, and wherein the multiplicative coefficients of the linear combination are selected such that the transfer function has linear phase.

5. The circuitry operative to produce a pre-emphasis signal or an equalization signal of claim 1, wherein the output signal is related to the first signal by a transfer function, and wherein the multiplicative coefficients of the linear combination are selected such that the transfer function has a predetermined phase characteristic.

6. The circuitry operative to produce a pre-emphasis signal or an equalization signal of claim 1, wherein the output signal is related to the first signal by a first transfer function, wherein the circuitry operative to produce a pre-emphasis signal or an equalization signal is coupled to at least one of transmitter circuitry, a link and receiver circuitry, wherein the at least one of the transmitter circuitry, the link and the receiver circuitry has a second transfer function, and wherein the multiplicative coefficients of the linear combination are selected such that the first transfer function compensates for phase distortion of the second transfer function.

7. An integrated circuit comprising the circuitry operative to produce a pre-emphasis signal or an equalization signal of claim 1.

8. A programmable logic device comprising the circuitry operative to produce a pre-emphasis signal or an equalization signal of claim 1.

9. A pre-emphasis filter or equalization filter wherein:

the pre-emphasis filter or equalization filter produces an output signal from an input signal, the output signal having a phase that is related to the phase of the input signal, the output signal corresponding to an odd number of equally spaced time samples of the input signal to which selectably or programmably variable multiplicative coefficients are applied to form a linear combination such that the variable multiplicative coefficients of the linear combination are symmetrical about the middle coefficient; wherein:

the pre-emphasis filter or equalization filter is implemented as a filter circuit comprising time delay circuitry operative to produce the equally spaced time samples of the input signal; the pre-emphasis filter or equalization filter comprising:

at least one current source producing a plurality of currents, each of the at least one current source being operative to produce a current with an amplitude related to one of the variable multiplicative coefficients of the linear combination, and a plurality of switches operative to selectively combine the plurality of currents to produce the output signal, each respective switch of the plurality of switches being operative to selectively couple one of the at least one current source to an output of the filter circuit to produce an output current signal, the respective switch of the plurality of switches being controlled by one of the input signal and the equally spaced time samples of the input signal.

10. The pre-emphasis filter or equalization filter of claim 9, wherein the output signal is related to the input signal by a transfer function, and wherein the variable multiplicative coefficients of the linear combination are selected such that the transfer function has a predetermined amplitude characteristic.

11. The pre-emphasis filter or equalization filter of claim 9, wherein the pre-emphasis filter or equalization filter is implemented in digital logic circuitry.

12. Signal processing circuitry that forms a linear combination of three related input signals, said signal processing circuitry comprising:

three current sources, each of said current sources producing a respective current with a respective amplitude related to a respective variable multiplicative coefficient of said linear combination of three related input signals; and three switches, each of said switches being controlled by a respective switch signal related to a respective one of the three input signals, the three switches being operative to selectively combine the currents produced by the three current sources to produce an output signal corresponding to the linear combination.

13. The signal processing circuitry of claim 12 wherein said three related input signals are differently-delayed versions of an original signal.

14. The signal processing circuitry of claim 12 wherein at least one of said current sources is programmably variable.

15. The signal processing circuitry of claim 12 wherein:
each of said three related input signals is a differential signal; and
each one of said three switches comprises two switch elements, and a respective differential lead of one of said three related input signals controls a respective one of said switch elements.

16. The signal processing circuitry of claim 15 each respective one of said current sources is controllably coupled to said output signal by a respective pair of said switch elements.

17. The signal processing circuitry of claim 16 further comprising:
two pull-up resistors; wherein:
each switch element in said respective pair of switch elements is between said respective one of said current sources and a respective one of said pull-up resistors.

18. The signal processing circuitry of claim 12 wherein each of said switches controllably couples a respective one of said current sources to said output signal.

19. The signal processing circuitry of claim 16 further comprising:
a pull-up resistor; wherein:
each respective one of said switches is between a respective one of said current sources and said pull-up resistor.

20. Circuitry operative to produce a pre-emphasis signal or an equalization signal from a first signal, the circuitry comprising:

first and second delay elements operative to produce, from the first signal, second and third signals corresponding to the first signal and delayed by one and two time steps, respectively; and circuitry operative to apply variable multiplicative coefficients to the first, second and third signals to form a linear combination of the first, second and third signals, such that the first and third signals have equal multiplicative coefficients in the linear combination, to produce an output signal corresponding to the linear combination, the circuitry operative to apply variable multiplicative coefficients comprising:

at least one current source producing currents related to the multiplicative coefficients in the linear combination, a plurality of switches operative to selectively combine the currents to produce the output signal, and a pull-up resistor; wherein:
each respective one of said switches is between a respective one of said at least one current source and said pull-up resistor.

21. A pre-emphasis filter or equalization filter wherein:
the pre-emphasis filter or equalization filter produces an output signal from an input signal, the output signal having a phase that is related to the phase of the input signal, the output signal corresponding to an odd number of equally spaced time samples of the input signal to which selectably or programmably variable multiplicative coefficients are applied to form a linear combination such that the variable multiplicative coefficients of the linear combination are symmetrical about the middle coefficient; the pre-emphasis filter or equalization filter comprising:

at least one current source producing a plurality of currents,
a plurality of switches operative to selectively combine the plurality of currents to produce the output signal, and
a pull-up resistor; wherein:
each respective one of said switches is between a respective one of said at least one current source and said pull-up resistor.

* * * * *